(12) United States Patent
Haupt et al.

(10) Patent No.: US 9,020,798 B2
(45) Date of Patent: Apr. 28, 2015

(54) REAL-TIME CAPABLE BATTERY CELL SIMULATION

(75) Inventors: Hagen Haupt, Altenbeken (DE); Thomas Schulte, Oerlinghausen (DE); Christian Vollbrecht, Bruhl (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 743 days.

(21) Appl. No.: 13/293,251

(22) Filed: Nov. 10, 2011

(65) Prior Publication Data

US 2012/0150503 A1    Jun. 14, 2012

(30) Foreign Application Priority Data

Dec. 10, 2010    (DE) .................. 10 2010 062 838

(51) Int. Cl.
| | |
|---|---|
| *G06G 7/54* | (2006.01) |
| *G01R 31/36* | (2006.01) |
| *H01M 10/42* | (2006.01) |
| *G06F 17/50* | (2006.01) |

(52) U.S. Cl.
CPC ........ *G01R 31/3651* (2013.01); *G06F 17/5009* (2013.01); *H01M 10/4285* (2013.01)

(58) Field of Classification Search
CPC ........... G01R 31/3648; G01R 31/3651; G01R 31/3658; G06F 17/5009; G06F 17/5036
USPC ........... 702/60, 63, 64; 324/433, 426; 701/22; 703/2, 13, 18
See application file for complete search history.

(56) References Cited

U.S. PATENT DOCUMENTS

2012/0101674 A1*  4/2012  Wang et al. ............... 701/22

FOREIGN PATENT DOCUMENTS

| | | |
|---|---|---|
| AT | 10 763 U2 | 9/2009 |
| DE | 20 2010 010 492 U1 | 11/2010 |

OTHER PUBLICATIONS

European Search Report dated Jul. 16, 2012 (with English language machine translation), 10 pages.
"Electrifying—High-precision cell voltage emulation with a dSPACE Hil simulator", dSPACE Magazine Mar. 2010—© dSPACE GmbH, Paderborn, Germany—info@dspace.com, www.dspace.com, (with English version), 12 pages.
Yongjun Yuan et al., "Assessment of Power Consumption Control Strategy for Battery Management System Using Hardware-In-the-Loop Simulation", IEEE Vehicle Power and Propulsion Conference (VPPC), Sep. 3-5, 2008, Harbin, China, 6 pages.

* cited by examiner

*Primary Examiner* — Aniss Chad
*Assistant Examiner* — Luke Osborne
(74) *Attorney, Agent, or Firm* — Orrick Herrington & Sutcliffe, LLP

(57) ABSTRACT

A system for real-time simulation of a battery comprising simulating a cell array by an overall computer model is disclosed. The model includes a plurality of single cells. A computer is connected via a cell voltage emulator to a control unit calculating terminal voltages of single cells by using the overall model and supplying the calculated terminal cell voltages to the control unit by the cell voltage emulator. The overall model comprises a first model which models a first single reference cell having cell parameters typical of the cell array and sending the total input current of the cell array to the first model as an input variable. The terminal voltage of the reference cell is calculated by the first model. The overall model further comprises a second model which calculates a deviation in the terminal voltage of an additional single cell from the terminal voltage of the reference cell.

20 Claims, 3 Drawing Sheets

REAL-TIME CAPABLE BATTERY CELL SIMULATION

CROSS REFERENCE TO RELATED APPLICATIONS

The present invention claims rights of priority to German Patent Application No. 10 2010 062 838.7, filed on Dec. 10, 2010, which is hereby incorporated by reference.

FIELD OF THE INVENTION

The invention relates to a method for simulating battery cells for testing a control unit and a system for simulating a battery comprising a cell array made up of a plurality of single cells.

BACKGROUND OF THE INVENTION

Hardware-in-the-loop (HIL) is a technology that is widely used for early testing and verification of the functionality of control units, e.g., in the automotive field. In this method, actual control units are tested in interaction with components simulated in real time to determine the extent to which they comply with the specified requirements. The environment of the control unit to be tested, consisting of actuators, sensors and the processes in the vehicle, is simulated in real time, and the behavior of the control unit is investigated in this simulated environment.

HIL simulation allows testing of control units in an early stage of development and testing of their response in the event of sensor defects, for example. If testing of control units in hybrid vehicles is to be conducted by HIL simulation, then it is useful to simulate the batteries as a system component. Batteries comprised of a plurality of single cells are used in hybrid vehicles. In particular, control units for battery control, so-called battery management systems (BMS), are tested by HIL simulation. The purpose of such a BMS is to monitor the cells in a cell array and thus ensure safe and reliable operation of the cell array for the longest possible time. For testing the BMS by HIL simulation, the behavior of a cell array should be simulated. For these reasons, models should be employed for simulation of single cells as well as for simulation of large cell assemblies.

In comparison with traditional battery models such as those used for on-board simulation, models for battery management systems should simulate the response of the battery as an interconnection of a plurality of single cells. In the single cell model, the cell voltage and state of charge and possibly also the temperature response of a battery cell are simulated. A typical cell response in different technologies such as Li ion, Ni-MH or lead may be taken into account. This includes differences in charging and discharging as well as the dynamic response in load tests and power loss due to gassing effects, for example. The model of the battery is then usually made up of a plurality of single cell models.

Single cell parameters and cell states such as the internal resistance of the initial state of charge should remain individually adjustable and the resulting cell voltages must also be made available to the BMS individually, for example, by a cell voltage emulator such as that described in the German patent application having the application number 102010043761.1. The currents then set by the BMS for charge balancing of the cells are also to be taken into account.

The electric terminal response of the battery is of particular interest in conjunction with HIL applications in the field of hybrid vehicles, electric vehicles or BMS.

For modeling the electric terminal response of cells, the approach of describing the terminal response through equivalent electric circuit diagrams is often chosen. This yields a good compromise between the complexity of the electrochemical processes taking place in a cell, on the one hand, and the essential simplifications, for example, to ensure real-time capability of the cell model, on the other hand. Another advantage of modeling of battery cells by means of equivalent electric circuits is the possibility of expanding the arrangement under consideration by adding additional components, such as power converters to the simulations.

Single-cell models for automotive simulation models such as those distributed by the applicant are composed of a cell voltage model and a model for the state of charge. The cell voltage model makes it possible to ascertain the parameters of individual physical effects such as the internal resistance, diffusion and the double layer capacitor. The state of charge model takes into account the charge current and the discharge current of the single cell as well as leakage currents such as those occurring due to gassing effects in charging NiMH cells. Against the background of such a single-cell model, a cell array of n cells may be assembled by connecting n single-cell models in a circuit. However, such a model is no longer easy to handle when there are a large number of single cells; beyond a certain number of single cells, it is also no longer real-time capable. This means that even when using specialized hardware for HIL simulations, the real-time requirements of the models can no longer be met. Testing of a control unit, which also tests the response time of a control unit, for example, therefore cannot be performed under conditions which reflect reality.

The possibility of simulating only one single cell and scaling the output variables by multiplying them times the number of cells n is not feasible for testing of BMS because in this case parameter controls and different states of charge of the single cells can no longer be modeled.

BRIEF SUMMARY OF THE INVENTION

A system and method for real-time simulation of a battery comprising simulating a cell array by means of an overall model on a computer unit is disclosed.

According to one embodiment of the present invention, a system and method is made available for real-time simulation of a battery, comprising a cell array made up of a plurality of single cells by an overall model on a computer unit, such that the computer unit is connected to a control unit test system by means of a cell voltage emulator. The terminal voltages of the single cells are calculated in the computer unit by using the overall model, and the calculated terminal voltages of the single cells are made available to the control unit test system. The overall model comprises a first model (also referred to as the reference model), wherein a first single cell is modeled as a reference cell by means of the first model using cell parameters that are typical of the cell array. The total input current of the cell array is supplied as an input variable to the first model, and the terminal voltage of the reference cell is calculated by means of the first model. In addition, the overall model comprises a second model (also referred to as the differential model), wherein a deviation in the terminal voltage of at least one additional single cell from the terminal voltage of the reference cell is calculated by using the second model. The terminal voltage of the additional single cell is calculated from the terminal voltage of the reference cell and the deviation in the terminal voltage of the additional single cell.

According to another aspect of the present invention, the terminal voltages of the entire battery and of the single cells and/or the state of charge of the battery and of the single cells and/or the battery temperature are calculated as a function of the charge current and the discharge current of the battery, i.e., as a function of the total current.

In an advantageous embodiment of the present invention, the deviation in the terminal voltage of each additional single cell from the terminal voltage of the reference cell is calculated by using the second model. The respective terminal voltage of each additional single cell can be calculated from the terminal voltage of the reference cell and the calculated deviation.

One advantage of the method and system according to the present invention is that the computation effort for calculating all the relevant variables of the reference cell and of the additional single cells is greatly reduced by means of the method according to the present invention in comparison with the calculation of said variables by means of n single cell models. Thus a real-time simulation for a battery with a much larger number of single cells is made possible. The use of storage is also optimized.

In accordance with one aspect of the invention, at least one variable and/or parameter such as the cell temperature, the ohmic resistance $R_{internal}$ or the state of charge is sent from the reference cell to the differential model. At least one of the variables of at least one additional single cell, such as the initial state of charge, the rated capacitance $C_{rated}$, i.e., the charge, which can be determined on a new cell under rated conditions, and the deviation in the resistance, temperature and/or terminal current is preset for the differential model. The terminal voltage deviation is calculated as a function of the preset variables.

Variables are understood here to refer in general to properties of a single cell or of the cell array, for example, the state of charge of a single cell. In particular, calculated variables or variables to be calculated are also referred to as simulation variables.

Parameters or cell parameters are also understood here to be variables, in particular preselected physical variables characterizing a physical property or a physical state of a single cell, for example.

The reduction in the computation time is obtained due to the fact that variables, for example, the cell temperature, among other parameters, are not simulated separately for each single cell but instead are determined from the simulation of the reference cell and the preselected temperature deviation of each single cell with respect to the reference cell. This saves on computation time. The reduction in computation time is necessary to be able to perform real-time simulations and/or to be able to ensure that the model will respond in real time to signals of the control unit to be tested and that a response approximating reality will be simulated for the control unit by means of the cell voltage emulator.

In accordance with another aspect of the invention, one may preselect input variables for the differential model in the form of vectors, e.g., n×1 vectors, where n denotes the number of additional cells to be considered. The complexity of the differential model is therefore independent of the number of cells to be taken into account. Therefore, only one second model for n additional single cells is needed. The number of additional single cells to be taken into account is obtained from the width of the preselected vectors.

There are various possibilities for dividing the differential model into submodels.

In one embodiment, the differential model comprises two submodels.

In a first submodel, the deviations leading to an electromotive force (EMF) which are different in comparison with those of the reference cell are taken into account whereas in a second submodel the deviations resulting in differences in the overvoltages are taken into account.

EMF is understood here to refer to the voltage difference between the two electrodes in an electrochemical cell in the resting state.

Overvoltage refers to the difference between the terminal voltage and the EMF which occurs in charging or discharging, for example. The overvoltage drops across the ohmic resistance of the cell and/or across all passive components of the circuit of the cell.

When the description of the model is scaled down from the battery level to the cell level, the requirements of the parameterization also increase. User-friendly graphical interfaces to represent this are preferred.

In accordance with one aspect of the invention, the method and system of the invention for the simulation of a battery comprising a cell array of several single cells by means of an overall model includes a computation unit and a cell voltage emulator connected to the computation unit, wherein the computation unit is equipped to execute the overall model for the calculation of the terminal voltages of the single cells and the cell voltage emulator and is designed to be connected to a control unit test system and to supply the calculated terminal voltages of the single cells to the control unit test system. According to one aspect of the present invention, the overall model comprises a first model and a second model. The first model is equipped to model a first single cell as a reference cell with typical cell parameters, to obtain the total input current of the cell array as an input variable and to calculate the terminal voltage of the reference cell. The second model is equipped to calculate the deviation in the terminal voltage of at least one additional single cell from the terminal voltage of the reference cell and to calculate the terminal voltages of the single cell from the deviation and the terminal voltage of the reference cell.

In accordance with another aspect of the invention, the system and method for the simulation of a battery cell for testing a control unit will now be explained in greater detail below on the basis of the exemplary embodiments in conjunction with the schematic drawings. Circuit parts having the same function are provided here with the same reference numerals.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles of the present embodiments.

DETAILED DESCRIPTION

A system and method for real-time simulation of a battery comprising simulating a cell array by means of an overall model on a computer unit is disclosed. The model of the cell array includes a plurality of single cells, a plurality of terminal voltages for the plurality of single cells, a plurality of terminal currents for the plurality of single cells, a total input current and cell parameters or variables for the plurality of single cells. The system and method disclosed further comprises connecting the computer unit via a cell voltage emulator to a control unit test system; calculating the plurality of terminal voltages of the plurality of single cells on the computer unit by using the overall model; and supplying the calculated plurality of terminal voltages of the plurality of single cells to the control unit test system by means of the cell voltage emulator. The overall model comprises a first model wherein a first single cell is modeled by means of the first model as a reference cell having cell parameters typical of the cell array and sending the total input current of the cell array to the first model as an input variable. The terminal voltage of the reference cell is calculated by means of the first model. The overall model further comprises a second model and, by means of the second model, a deviation in the terminal voltage of at least one additional single cell from the terminal voltage of the reference cell is calculated and calculating the terminal voltage of at least one additional single cell from the terminal voltage of the reference cell and the deviation in the terminal voltage of at least one additional single cell.

Figure 1:
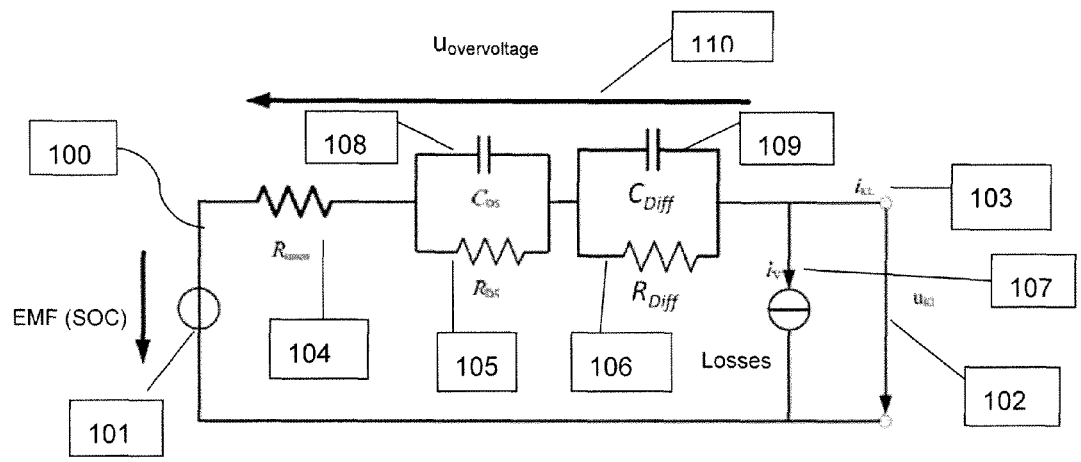
FIG. 1 illustrates an equivalent electric circuit of an electrochemical cell.

Referring to FIG. 1, the equivalent circuit 100 for an electrochemical cell is shown, such as that used in the prior art as the basis for the model of an individual battery cell. With the help of this equivalent circuit diagram 100, the terminal voltage of the cell is calculated. It should be pointed out that the method according to the invention is independent of the parameterization selected, for which there are various possibilities for implementation. In principle, other models based on a different equivalent circuit may also be used for the modeling.

FIG. 1 shows first the variables of the terminal voltage 102 $u_{KI}$ and of the terminal current 103 $i_{KI}$ that are measurable at the terminals of a cell, and it should also be pointed out here that a positive terminal voltage corresponds to charging of the cell and a negative terminal voltage corresponds to discharging the cell.

In addition, the equivalent circuit diagram 100 comprises a voltage source 101 with a voltage labeled as EMF. This describes the electromotive force (EMF) of a cell. Another important aspect in the equivalent circuit diagram in FIG. 1 is the network of passive components 104, 105 and 106 for describing the overvoltages in the cell. During charging, a higher voltage drops at the terminals of the cell than between the two electrodes of the cell, and in discharging the terminal voltage is lower than the voltage between the two electrodes. These components of the terminal voltage are modeled by the network from passive components.

The current source with the current 107 $i_V$ which can be seen in FIG. 1 models the leakage currents occurring in an electrochemical cell.

The potential of an electrode is obtained from the standard redox potential of the respective electrode and a component which depends on the activity of the reduced and oxidized species and thus on their concentration according to the Nernst equation.

With lithium ion cells, for example, the effect that the lattice structure into which the lithium atoms are incorporated changes after a certain quantity of incorporated lithium, depending on the electrode material used, which also leads to changes in the electrode potential. A larger quantity of incorporated lithium will be found in one electrode or the other, depending on the state of charge of the cell. This quantity of incorporated lithium then has an influence on the potential of the electrode, first via the dependence of the lattice structure on the quantity of lithium but secondly also via the activity of the oxidized or reduced lithium which depends directly on the lithium concentration. Such material-specific effects may be included in the battery model depending on which technology is to be described.

The electrode potentials of an electrochemical cells and thus also the electromotive force of a cell are therefore a function of the state of charge (SOC) of the cell.

The state of charge of a cell is also known as the SOC and is given in percentage. The SOC is obtained from the charge of a cell, based on the rated capacitance of the cell. A fully charged cell has an SOC of 100% while a fully discharged cell has an SOC of 0%.

Figure 2:
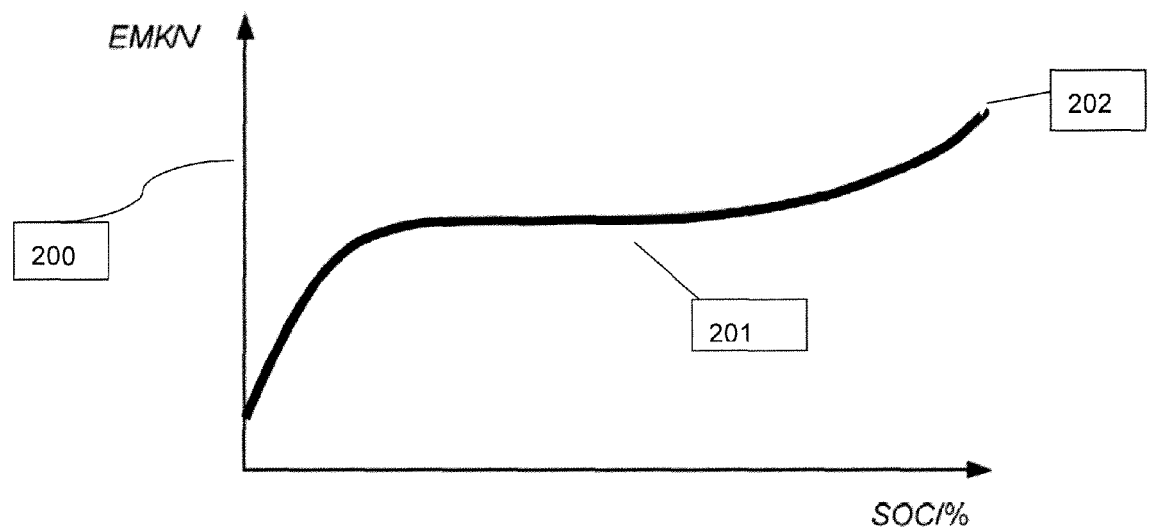
FIG. 2 illustrates a schematic EMF-SOC relationship for an Li ion cell.

FIG. 2 shows the EMF-SOC relationship 200 of a monotonically rising curve 201. The maximum EMF is thus reached at an SOC=100% 202. If the state of charge of the cell is then reduced, then first a somewhat sharper decline in the EMF is noticed. Next there is a range in which the EMF changes only slightly and then drops sharply at a low state of charge of the cell. Depending on the materials used for the electrodes, there may be certain variations with regard to the course, for example, variations in the characteristics in the middle range. This dependence is modeled by using an equivalent electric circuit diagram 100 from FIG. 1 through the controlled voltage source 101 EMF (SOC).

An equation for EMF as a function of SOC is sometimes used in the prior art and in some cases the relationship is modeled by means of controlled voltage sources and data stored in engine characteristic maps or an approximation of the EMF-SOC relationship. Various methods are used to approximate the EMF-SOC, for example, the linear interpolation method, the linear extrapolation method or mixed forms thereof.

The prevailing state of charge of the cells is determined by integration of the effective charge current or discharge current $$SOC = SOC_0 + \frac{1}{C_{rated}} \int i_{Kl} - i_V \, dt \qquad \text{(equation 1)}$$

The resistance 104 $R_{internal}$ in the equivalent electric circuit diagram 100 of FIG. 1 describes the ohmic resistance of the electrochemical cell. This internal resistance is composed of the resistance of the electrode materials and the resistance of the electrolyte.

It may happen that, depending on the material used, the resistance of the electrodes may be dependent on the state of charge. It is also possible that the resistance 104 $R_{internal}$ depends on the SOC.

Another aspect with regard to the resistance 104 $R_{internal}$ is its dependence on temperature. The temperature dependence results mainly from the resistance component of the electrolyte which depends on temperature. The literature contains various approaches with regard to the internal resistance of electrochemical cells. The internal resistance in the equivalent circuit diagram is thus assumed to be constant, depending on the temperature or depending on the SOC. The parameter characteristics map may be expanded to describe such relationships. Expansion of the model is not necessary but a current dependent of the internal resistance may also be taken into account.

The RC element consisting of the resistance 105 $R_{DS}$ and the capacitance 108 $C_{DS}$, which are discernible in the equivalent electric circuit diagram 100 in FIG. 1, serves to take into account the dynamic characteristics of the overvoltages 110.

These dynamic characteristics can be attributed to processes taking place at the boundary between the electrode and the electrolyte.

The opposite charges of different polarization with the layer of aligned electrolyte dipoles as the dielectric create a so-called double layer capacitor, which cannot be disregarded because of the small distance between the two charge layers and the large electrode surface area resulting from the porosity of the electrode material. Based on this double layer capacitor, the capacitor 108 $C_{DS}$ is added to the equivalent electric circuit diagram 100.

The equivalent circuit diagram 100 on which the cell model is based may also be expanded by adding an additional RC element (106 $R_{Diff}$, 109 $C_{Diff}$) to allow dynamic overvoltage components to be taken into account with a larger time constant.

The voltage components with a larger time constant can be attributed to diffusion processes in the electrolyte. However, diffusion processes may alternatively also be taken into account by means of a diffusion layer model.

The losses occurring in an electrochemical cell are taken into account by a current source in the equivalent circuit diagram 100. The leakage current 107 $i_V$ which occurs results in the fact that the total terminal current does not contribute toward an increase in the energy stored in the cell when charging the cell and in discharging the total energy converted from chemical form to electrical form cannot be picked up at the terminals of the cell. The current loss 107 $i_V$ of the cell depends on the cell terminal voltage and the temperature. Taking into account the current loss is not relevant for all cell technologies.

Figure 3:
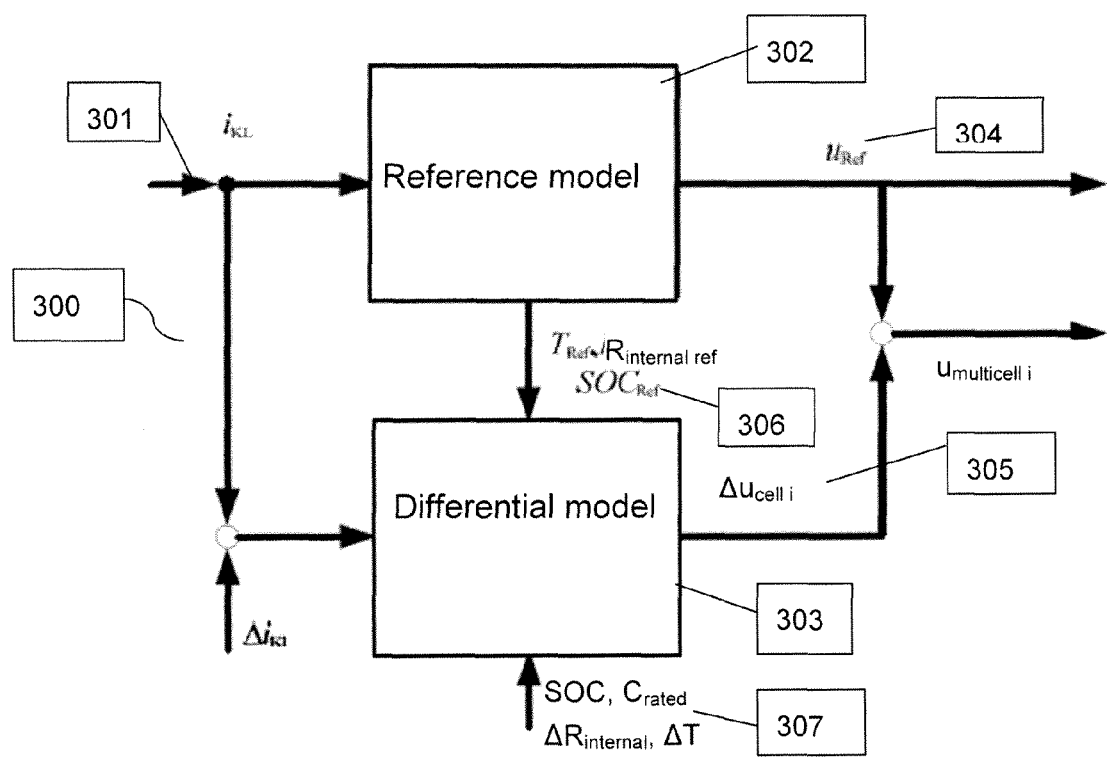
FIG. 3 illustrates the structure of an overall model according to the invention.

Referring now to FIG. 3 an overall model 300 according to the invention for a battery comprising multiple (n+1) single cells is shown.

The reference model 302 is formed by a single cell model such as that known in the prior art. It receives the input current 301 of the cell array, i.e., the charging current and discharging current of the battery as an input variable, where this is usually calculated in a further simulation model. By the reference model 302 the behavior of a first single cell in the cell array is simulated. The first single cell has the reference values of the cell array to be simulated with respect to the cell parameters and the state of charge. Reference values for the cells in the array can be taken from the corresponding data sheets of the battery or can be determined from measurements on a single cell for typical cell parameters, such as capacitance or internal resistance.

A second portion of the overall model is formed by a second model, the differential model 303. In this second model 303, the deviation in the terminal voltage of the i-th additional single cell $\Delta u_{cell\ i}$ from the terminal voltage of the reference cell 304 $u_{ref}$ 305 is calculated. A deviation in the terminal voltage of an additional single cell from the terminal voltage of the reference cell may result from deviations in the cell parameters of the additional single cell, such as the internal resistance or the capacitance, a different state of charge, a different cell temperature or deviations in the terminal voltages. Such deviations in the terminal voltages occur, for example, due to the fact that the BMS sets different currents for the respective additional single cells for the so-called cell balancing of the cells. The deviations in additional single cells of the cell array from the reference cell are thus taken into account by the second model. This model is therefore also referred to as a differential model 303. The differential model 303 receives input variables 306, 307 that can be varied during the simulation, such as the terminal current $i_{KI}$, i.e., the total current, and the deviation in the terminal current $\Delta i_{KI}$ for each additional single cell, the cell temperature, the ohmic resistance $R_{internal}$ or the state of charge of the reference cell. At least one of the following parameters 307 is preferably preset for the differential model 303: the initial state of charge, the rated capacitance and the deviations from the resistance and/or temperature of the respective additional single cells. The deviation in the terminal voltage $\Delta u_{cell\ i}$ is calculated for the additional single cells as a function of the parameters and the simulation variables. The terminal voltage of the i-th cell is determined from the terminal voltage of the reference cell 304 and the deviation with respect to this i-th cell 305.

In a specific embodiment the differential model 303 receives the deviations in the terminal voltage as variable input variables and the predetermined parameters in vectorial form, e.g., as n×1 vectors.

In another specific embodiment the overall model is implemented by means of a graphical programming language such as Simulink from the company The Mathworks.

Figure 4:
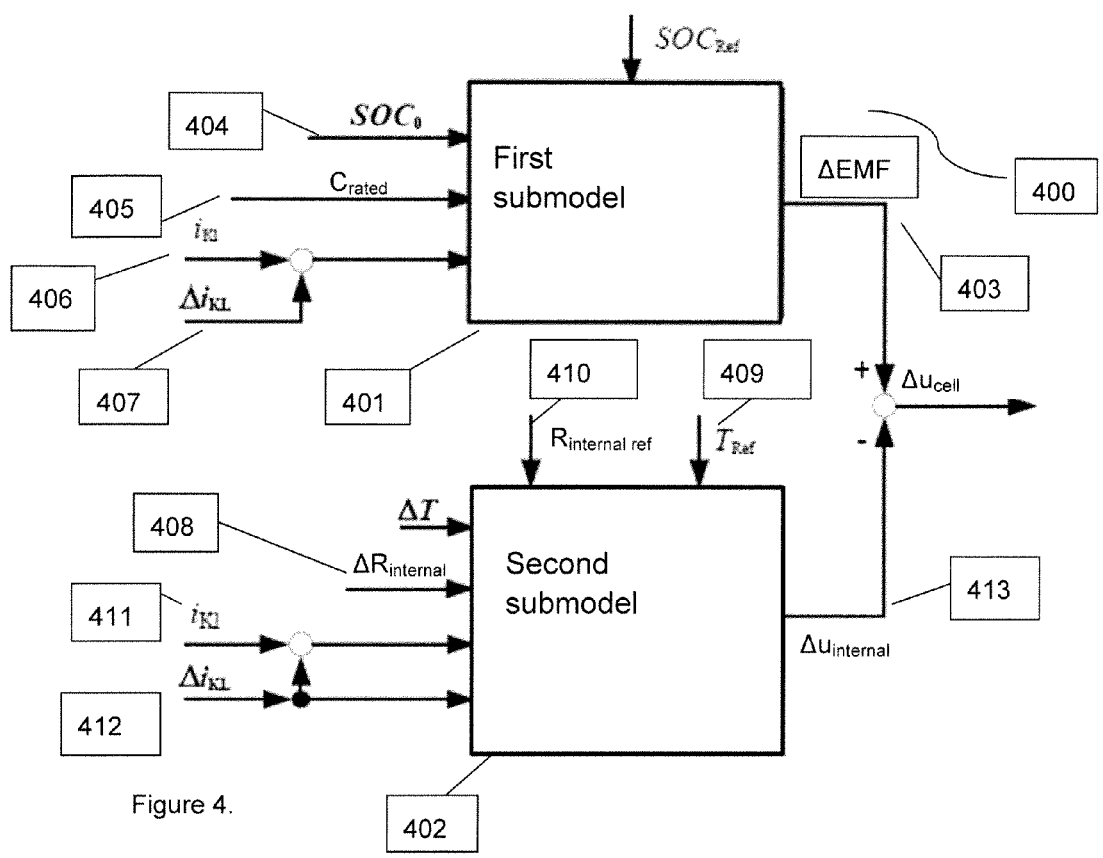
FIG. 4 illustrates the structure of a differential model having a first submodel and a second submodel.

FIG. 4 illustrates the structure of the differential model 400. It is divided into two submodels: a first submodel 401 in which the deviations are taken into account, leading to a different EMF of at least one additional single cell in comparison with the reference cell 302 of FIG. 3, and a second submodel 402, with which the deviations in variables of the additional single cells, resulting in a difference in the overvoltages of the additional single cells with respect to the reference cell, are taken into account.

The first submodel 401 determines the difference in the EMF 403 (ΔEMF) of the additional single cells with respect to the EMF of the reference cell 302 of FIG. 3 from the initial states of charge 404 $SOC_0$, the rated capacitances 405 $C_{rated}$ and the terminal currents of the additional single cells of the cell array (where the terminal current of an additional single cell is composed of the terminal current of the reference cell 406 $i_{KI}$ and the predetermined differential terminal current 407 $\Delta i_{KI}$). The initial state of charge 404 $SOC_0$ and rated capacitance 405 $C_{rated}$ are represented here by a shared value for all cells in a preferred specific embodiment. Depending on how the EMF is approximated, additional simulation variables or parameters may be transferred, e.g., the state of charge of the reference cell 306 of FIG. 3 $SOC_{ref}$.

First, according to equation 1, the SOC of each additional single cell is determined from a predetermined initial state of charge and by integration of the terminal current of the respective additional single cell.

Then there is a determination of the range of the EMF (SOC) curve, in which the reference cell and the respective additional single cells of the cell array are located to then determine the EMF of the reference cell and the additional single cells from an approximated EMF-SOC relationship. An approximation may be performed if the relationship with the model is not stored in a table.

In the second submodel 402 of the differential model 400, deviations with respect to the terminal voltage of the reference cell obtained as a result of differences in the terminal currents 412 $\Delta i_{KI}$ of the respective additional single cells and the ohmic resistances 408 $\Delta R_{internal}$. Differences in the terminal currents in the additional single cells may occur due to leakage currents of different amounts or due to interventions by the BMS. Differences in the internal resistance $R_{internal}$ between the single cells of the battery may be attributed to scattering in the production or different cell temperatures. The deviation of overvoltages 413 $\Delta u_{internal}$ of an additional single cell to be taken into account with respect to the overvoltage $u_{internal}$ of the reference cell is thus obtained according to equation 2:

$$\Delta u_{internal} = \Delta R_{internal} i_{KI} + \Delta R_{internal} \Delta i_{KI} R_{internal} \Delta i_{KI} \quad \text{(equation 2)}$$

The second submodel 402 receives from the reference model the cell temperature 409 $T_{ref}$, the ohmic internal resistance 410 $R_{internal\ ref}$ and the terminal current 411 $i_{KI}$ of the reference cell. The differences in these variables ($\Delta R_{internal}$, $\Delta T$, $\Delta i_{KI}$) of the additional single cells of the cell array from those of the reference cell are preferably specified externally.

The resistance component is composed of two parts:

$$\Delta R_{internal} = \Delta R_{internal}(T) + \Delta R_O \quad \text{(equation 3)}$$

The resistance $\Delta R_O$ describes the difference in the resistance $R_{internal}$ of the reference cell from that of an additional single cell which may occur due to the manufacturing processes. $\Delta R(T)$ in turn models resistance differences, which occur due to the temperature dependence of the ohmic internal resistance, from the temperature differences between the reference cell and an additional single cell of the cell array.

The value $\Delta R(T)$ may in turn be determined in the same way as the $\Delta EMF$ 403 value in the first submodel 401. For example, both values may be determined by using tables in the model for the reference cell. Based on the temperature of the reference cell and the additional single cell which results from the sum of the reference cell temperature and the difference $\Delta T$, there is a determination of the range of the internal resistance-temperature characteristic line where the reference cell and the additional single cell are located. The internal resistance of the reference cell and the additional single cell may be determined from an approximated internal resistance-temperature characteristic line.

The approximation may be performed, for example, by means of linear equations as is the case in approximation of the EMF, or by specifying the slope and then performing a linear interpolation.

In the second submodel 402, differences in the parameters $R_{DS}$ and $R_{Diff}$ (see FIG. 1, 105 and 106) may be taken into account by means of $\Delta R_O$. $R_{Diff}$ here denotes the resistance of the second RC element 106 in FIG. 1 from the equivalent circuit diagram 100 with which diffusion processes are taken into account. It should be pointed out that the differences in the terminal voltages, which are to be attributed to deviations in the values for $R_{DS}$ and $R_{Diff}$, are applied immediately and not just after the transient recovery time of the RC elements in the single cell model.

One advantage of the differential model is that depending on the degree of detail with which a cell array is to be simulated with the overall model, additional submodels may be added to the differential model or removed from the differential model without having any effect on other parts of the differential model. Depending on how detailed the simulation of the cell array should be, more model parts of the first model are inserted into the differential model.

Thus in one specific embodiment of the invention, the temperature of an additional single cell in the cell array is transferred from the first model in the battery simulation using the overall model. The additional single cell in the cell array, which has a temperature difference $\Delta T$ with respect to the reference cell at the beginning of the simulated period of time thus has this temperature difference during the entire simulated time range. However, this is not consistent with reality or the simulation with the single cell model because the thermal power emitted by a single cell is greater at a higher cell temperature. The greater thermal radiation is not taken into account by a constant temperature difference $\Delta T$, if the temperature of the reference cell is used in the simulation of the single cells of the cell array. If such temperature effects are also taken into account in the simulation of a cell array, then in another specific embodiment of the invention, the differential model for determining the respective temperature for the additional single cells (and/or the deviation in the temperature from the temperature of the reference cell) is expanded by adding a temperature model, i.e., another submodel of a single cell (like the first submodel to determine the deviation in the EMF or the second submodel to determine the deviation in the overvoltage).

In one specific embodiment, series-connected battery cells are explicitly simulated using the overall model.

In another specific embodiment, parallel connected cells are simulated by combining the parallel circuit of the single cells to form a single cell of a higher capacitance accordingly.

The voltage deviation of each additional single cell from the terminal voltage of the reference cell is calculated by summation of the voltage deviations calculated for the additional single cells in the individual submodels of the differential model. In addition in another specific embodiment, voltage deviations based on additional external cell currents of the additional single cells are taken into account. In another specific embodiment inductances of the additional single cells as well as thermal losses are taken into account. Various changes, modifications, variations, as well as other uses and applications of the subject invention may become apparent to those skilled in the art after considering this specification together with the accompanying drawings and claims. All such changes, modifications, variations, and other uses and applications which do not depart from the spirit and scope of the invention are intended to be covered hereby and limited only by the following claims.

What is claimed is:

1. A method for real-time simulation of a battery comprising: simulating a cell array by means of an overall model on a computer unit;
the model for the simulated cell array comprising:
a plurality of single cells;
a plurality of terminal voltages for the plurality of single cells;
a plurality of terminal currents for the plurality of single cells;
a total input current;
cell parameters or variables for the plurality of single cells; and
connecting the computer unit via a cell voltage emulator to a control unit test system; and
calculating the plurality of terminal voltages of the plurality of single cells on the computer unit by using the overall model; and
supplying the calculated plurality of terminal voltages of the plurality of single cells to the control unit test system by means of the cell voltage emulator; wherein
the overall model comprises a first model; and
wherein a first single cell is modeled by means of the first model as a reference cell having cell parameters typical of the cell array; and
sending the total input current of the cell array to the first model as an input variable, and
calculating the terminal voltage of the reference cell by means of the first model, and the overall model further comprises a second model;
calculating by the second model a deviation in the terminal voltage of at least one additional single cell from the terminal voltage of the reference cell, and calculating the terminal voltage of the at least one additional single cell from the terminal voltage of the reference cell and the deviation in the terminal voltage of the at least one additional single cell.

2. The method according to claim 1, further comprising calculating the deviation in the terminal voltage of each individual single cell from the terminal voltage of the reference cell.

3. The method according to claim 1 further comprising calculating the deviation in the terminal voltage of the at least one additional single cell in comparison with the terminal voltage of the reference cell, wherein a deviation of at least one variable or cell parameter of the at least one additional single cell with respect to the corresponding at least one variable or cell parameter of the reference cell is predetermined for the second model.

4. The method according to claim 3, further comprising selecting at least one variable or cell parameter calculated for the reference cell in the first model and determining the corresponding variable or cell parameter for the at least one additional single cell from the selected at least one variable or cell parameter of the reference cell and the predetermined deviation of the corresponding at least one variable or cell parameter of the at least one additional single cell without individually simulating the selected at least one variable or cell parameter of the at least one additional single cell to reduce calculation time.

5. The method according to claim 4, wherein at least one input variable or cell parameter is predetermined for the second model in vectorial form, such that the vector length is determined by the number of additional single cells taken into account.

6. The method according to claim 1, further comprising calculating an electromotive force and an overvoltage for the plurality of single cells; and wherein the second model has a first submodel, wherein the deviation in the electromotive force of the at least one additional single cell with respect to the reference cell is calculated by using the first submodel.

7. The method according to claim 1, wherein the second model has a second submodel, wherein the deviation in the overvoltage of the at least one additional single cell with respect to the overvoltage of the reference cell is calculated by using the second submodel.

8. The method according to claim 1, further comprising adding at least one additional submodel to the second model for simulation of an additional variable or cell parameter with respect to the at least one additional single cell to increase the accuracy of the simulation.

9. The method according to claim 8, wherein one submodel is removed from the second model, such that in the simulation of the battery by the overall model, the additional variable or cell parameter previously determined by the simulation in the removed submodel is determined by the corresponding additional variable or cell parameter of the reference cell and the predetermined deviation in the additional variable or cell parameter of the at least one additional single cell.

10. The method according to claim 1, wherein at least one variable or cell parameter is stored in a table or is approximated.

11. The method according to claims 1, wherein the assembly of the single cells of the battery is simulated as a series connection.

12. The method according to claim 1, wherein the connection of the single cells of the battery is simulated as a parallel circuit by modeling a plurality of parallel-connected additional single cells as an additional single cell resulting in a higher internal capacitance.

13. A system for simulation of a battery comprising a cell array of a plurality of single cells comprising;
   a computation unit having an overall model and a cell voltage emulator connected to the computation unit;
   wherein the computation unit is equipped to execute the overall model for calculation of the terminal voltages of the single cells; and
   wherein the cell voltage emulator is connected to a control unit test system for
   supplying the calculated terminal voltages of the single cells to the control unit test system;
   wherein the overall model comprises a first model; and
   wherein the first model is equipped to model a first single cell as a reference cell having cell parameters or variables typical of the cell array, to obtain the total input current of the cell array as an input variable and to calculate the terminal voltage of the reference cell; and
   wherein the overall model comprises a second model, wherein the second model is equipped to calculate the deviation in the terminal voltage of at least one additional single cell from the terminal voltage of the reference cell, and to calculate the terminal voltages of the additional single cell from the deviation and the terminal voltage of the reference cell.

14. The system according to claim 13, wherein at least one input variable or cell parameter is predetermined for the second model in vectorial form, such that the vector length is determined by the number of additional single cells taken into account.

15. The system according to claim 13, wherein via the first model an electromotive force and an overvoltage for the reference cell are calculated; and wherein the second model has a first submodel, wherein the deviation in the electromotive force of the at least one additional single cell with respect to the reference cell is calculated by using the first submodel; and wherein the second model has a second submodel, wherein the deviation in the overvoltage of the at least one additional single cell with respect to the overvoltage of the reference cell is calculated by using the second submodel.

16. The system according to claim 15, wherein the second model includes at least one additional submodel for simulation of an additional variable or cell parameter with respect to the at least one additional single cell to increase the accuracy of the simulation.

17. The system according to claims 16, wherein one submodel is removed from the second model, such that in the simulation of the battery by the overall model, the additional variable or cell parameter previously determined by the simulation in the removed submodel is determined by the corresponding additional variable or cell parameter of the reference cell and the predetermined deviation in the additional variable or cell parameter of the at least one additional single cell.

18. The system according to claim 13, wherein at least one variable or cell parameter is stored in a table or is approximated.

19. The system according to claims 13, wherein the assembly of the single cells of the battery is simulated as a series connection.

20. The system according to claim 13, wherein the connection of the single cells of the battery is simulated as a parallel circuit by modeling a plurality of parallel-connected additional single cells as an additional single cell resulting in a higher internal capacitance.

* * * * *